(12) United States Patent
Salove et al.

(10) Patent No.: US 7,551,027 B2
(45) Date of Patent: Jun. 23, 2009

(54) RF POWER AMPLIFIER MIRROR CIRCUIT FOR SENSING CURRENT

(75) Inventors: Matthew J. Salove, Portland, OR (US); William H. Davenport, Portland, OR (US); Ray M. Parkhurst, Hillsboro, OR (US); Jin W. Cho, Hillsboro, OR (US)

(73) Assignee: Tri Quint Semiconductor, Inc., Hillsboro, OR (US)

( * ) Notice: Subject to any disclaimer, the term of this patent is extended or adjusted under 35 U.S.C. 154(b) by 98 days.

(21) Appl. No.: 11/684,575

(22) Filed: Mar. 9, 2007

(65) Prior Publication Data

US 2008/0218261 A1    Sep. 11, 2008

(51) Int. Cl.
*H03G 3/20* (2006.01)
(52) U.S. Cl. .................................. 330/140; 330/296
(58) Field of Classification Search .......... 330/140, 330/279, 285, 295, 296
See application file for complete search history.

(56) References Cited

U.S. PATENT DOCUMENTS

| | | | |
|---|---|---|---|
| 5,497,125 A | 3/1996 | Royds | |
| 5,789,984 A | 8/1998 | Davis et al. | |
| 6,198,347 B1 | 3/2001 | Sander et al. | |
| 6,208,875 B1 | 3/2001 | Damgaard et al. | |
| 6,265,939 B1 | 7/2001 | Wan et al. | |
| 6,265,943 B1 * | 7/2001 | Dening et al. | 330/296 |
| 6,407,639 B1 | 6/2002 | Jean et al. | |
| 6,522,202 B2 | 2/2003 | Brandt | |
| 6,528,983 B1 * | 3/2003 | Augustine | 324/95 |
| 6,566,944 B1 | 5/2003 | Pehlke | |
| 6,614,309 B1 | 9/2003 | Pehlke | |
| 6,653,902 B1 | 11/2003 | Bachhubr et al. | |
| 6,734,729 B1 | 5/2004 | Andrys et al. | |
| 6,850,119 B2 | 2/2005 | Arnott | |
| 6,950,636 B2 | 9/2005 | Rozenblit et al. | |
| 7,106,137 B2 | 9/2006 | Dupuis et al. | |
| 7,190,935 B2 * | 3/2007 | Hecht | 455/127.1 |

\* cited by examiner

*Primary Examiner*—Khanh V Nguyen
(74) *Attorney, Agent, or Firm*—Booth Udall, PLC

(57) ABSTRACT

An apparatus and method is disclosed for providing a mirror circuit for detecting a change in current of a RF power amplifier. The mirror circuit includes a voltage operably coupled with the mirror circuit, a bias circuit operably coupled with the mirror circuit, wherein the bias circuit is capable of applying a bias voltage to the mirror circuit, and an output reference signal. The output reference signal is proportional to the change of current in the RF power amplifier.

22 Claims, 2 Drawing Sheets

US 7,551,027 B2

RF POWER AMPLIFIER MIRROR CIRCUIT FOR SENSING CURRENT

TECHNICAL FIELD OF THE INVENTION

Embodiments of the present invention relate generally to radio frequency (RF) power amplifiers and more specifically, to a RF power amplifier mirror circuit for sensing current of an output RF power amplifier.

BACKGROUND OF THE INVENTION

Radio frequency (RF) power amplifiers are often used in portable battery operated wireless devices, such as cellular telephones. Extending the battery life is a key concern for users and manufacturers of these battery operated wireless devices. One of the key factors in determining the battery life of the battery operated wireless device is the power consumption of the RF power amplifiers. The RF power amplifiers are designed to operate into an optimal load impedance and are typically coupled to an antenna of the battery operated wireless device.

However, under a load mismatch condition, such as, for example, when the antenna of the battery operated wireless device approaches objects (e.g. metal structures, human contact, or the like), the load impedance of the RF power amplifier changes and the RF power amplifier draws excess current. In some cases, the current can exceed more than two times the current drawn under an optimal load impedance. When the RF power amplifier draws excess current, the battery life of the battery operated wireless device is reduced. In addition, the adjacent channel power ratio (ACPR) and error vector magnitude (EVM) linearity and distortion limits are often exceeded when the RF power amplifier draws excess current. This reduction in battery life and distortion limits of the battery operated wireless device is undesirable.

FIG. 1 shows a schematic diagram of a current sense circuit 100 according to the prior art. Current sense circuit 100 includes a sense circuit 102, a battery voltage Vbatt, an RFin signal, a RFout signal and a Vsense signal. Sense circuit 102 includes an output transistor Q1, an inductor L1, a resistor R1, and a comparator 104. As the current in output transistor Q1 increases, due to, for example, a mismatch condition, comparator 104 senses the voltage drop across resistor R1 and provides a corresponding voltage signal, i.e., Vsense signal.

However, the use of the series resistor in the battery path is disadvantageous because even under normal operation, the series resistor is always in series with the battery. Among other things, this reduces the efficiency of the output transistor Q1 and decreases the battery life of the battery operated wireless device, which, as described above, is a disadvantage for users and manufacturers of these battery operated wireless devices.

BRIEF DESCRIPTION OF THE DRAWINGS

The novel features believed to be characteristic of embodiments of the invention are set forth in the appended claims. However, embodiments of the invention will best be understood by reference to the following detailed description when read in conjunction with the accompanying drawings, wherein embodiments of the invention are illustrated by way of example, and not by way of limitation, in the figures of the accompanying drawings in which like reference numerals refer to similar elements.

DETAILED DESCRIPTION OF THE INVENTION

Reference will now be made to the following detailed description of the exemplary embodiments of the present invention. Those skilled in the art will recognize that embodiments of the present invention provide many inventive concepts and novel features that are merely illustrative and not to be construed as restrictive. Accordingly, the specific embodiments discussed herein are given by way of example and do not limit the scope of the embodiments of the present invention. In addition, those skilled in the art will understand that for purposes of explanation, numerous specific details are set forth, though embodiments of the invention can be practiced without these specific details, and that certain features have been omitted so as to more clearly illustrate embodiments of the invention.

Figure 1:
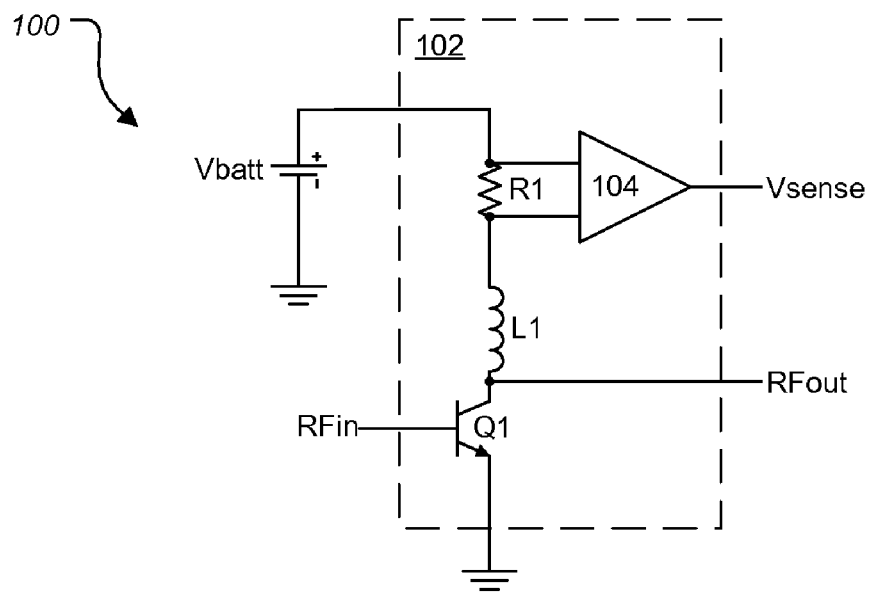
FIG. 1 illustrates a schematic diagram of a current sense circuit according to the prior art.
Figure 2:
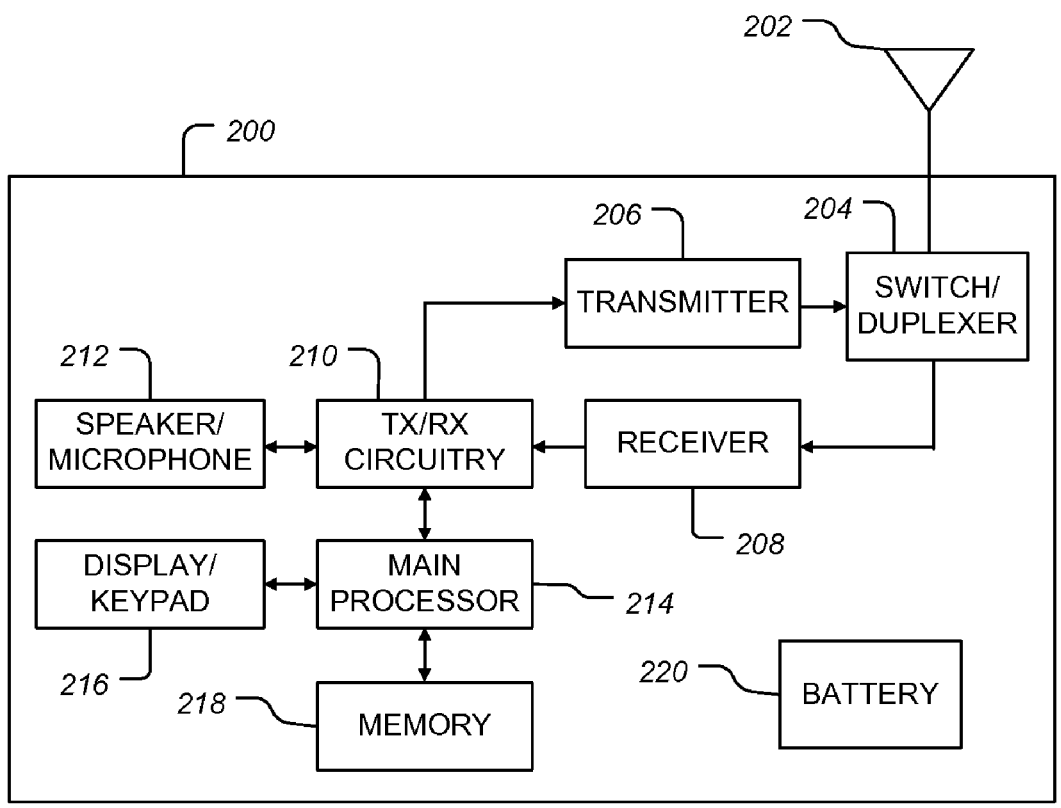
FIG. 2 illustrates a high-level block diagram of a wireless device according to an exemplary embodiment of the present invention.

FIG. 2 illustrates a high-level block diagram of a wireless device 200 according to an exemplary embodiment of the present invention. In one embodiment of the present invention, wireless device 200 comprises an antenna 202, a switch/duplexer 204, a transmitter 206, a receiver 208, TX/RX circuitry 210, a speaker/microphone 212, a main processor 214, a display/keypad 216, a memory 218, and a battery 220. Wireless device 200 may be any wireless device, including, but not limited to, conventional cellular telephones, paging devices, personal digital assistant devices, text-messaging devices, portable computers, or any other like device capable of wireless communication.

As will be explained below in greater detail, transmitter 206 comprises radio frequency (RF) power amplifier circuitry including one or more RF power amplifier mirror circuits, one or more RF power amplifier stages, and other like circuitry. In one embodiment of the present invention, the RF power amplifier circuitry of transmitter 206 is formed on a Gallium Arsenide (GaAs) substrate. However, other semiconductor materials (e.g., silicon, indium phosphide, gallium nitride) may be used. In addition, for purposes of illustration and ease of explanation, embodiments of the present invention are described in terms of bipolar junction transistor (BJT) technology (e.g., heterojunction bipolar transistors (HBTs)). However, embodiments of the invention may be practiced using other transistor technology, including, for example, but not limited to, field effect transistor (FET) technology (e.g., metal-semiconductor field effect transistors (MESFETs) and pseudomorphic high electron mobility transistors (pHEMTs)) or complementary metal-oxide semiconductor (CMOS) technology.

TX/RX circuitry 210 receives from antenna 202 an incoming signal transmitted by, for example, a communication system or a wireless network provider, through switch/duplexer 204 and receiver 208. TX/RX circuitry 210 processes and sends the incoming signal to the speaker (i.e., voice data) or to main processor 214 (e.g., web browsing) for further processing. Likewise TX/RX circuitry 210 receives analog or digital voice data from the microphone or other outgoing data (e.g., web data, e-mail) from main processor 214. TX/RX circuitry 210 transmits an RF signal that is transmitted through transmitter 206 via antenna 202.

Main processor 214 executes a basic operating system program stored in memory 218 in order to control the overall operation of wireless device 200. For example, main processor 214 controls the reception of signals and the transmission of signals by TX/RX circuitry 210, receiver 208, and transmitter 206. Main processor 214 is capable of executing other processes and programs resident in memory 218 and may move data into or out of memory 218, as required by an executing process.

Main processor 214 is also coupled to display/keypad 216. The user of wireless device 200 uses the keypad to enter data into wireless device 200. The display may be a liquid crystal display capable of rendering text and/or at least various graphics; alternate embodiments may use other types of displays. Battery 220 is operably coupled with the electrical components of wireless device 200, in accordance with known electrical principles.

Those skilled in the art will recognize that wireless device 200 is given by way of example and that for simplicity and clarity, only so much of the construction and operation of wireless device 200 as is necessary for an understanding of the present invention is shown and described. For example, wireless device 200 is capable of communicating using one or more of a number of conventional standards, including, but not limited to GSM/EDGE, CDMA, W-CDMA, or the like. In addition, or as an alternative, although an exemplary wireless device 200 is shown and described, embodiments of the present invention contemplate any suitable component or combination of components performing any suitable tasks in association with wireless device 200, according to particular needs. Moreover, it is understood that wireless device 200 should not be construed to limit the types of devices in which embodiments of the present invention may be implemented.

In accordance with the principles of embodiments of the present invention, the RF power amplifier circuitry of transmitter 206 of wireless device 200 provides for detecting the current in the RF power amplifier circuitry, as described below in greater detail. In addition, or as an alternative, the mirror circuit of FIG. 3 provides an output reference signal that is proportional to the degree of current consumption of the output RF power amplifier associated with the RF power amplifier circuitry.

Figure 3:
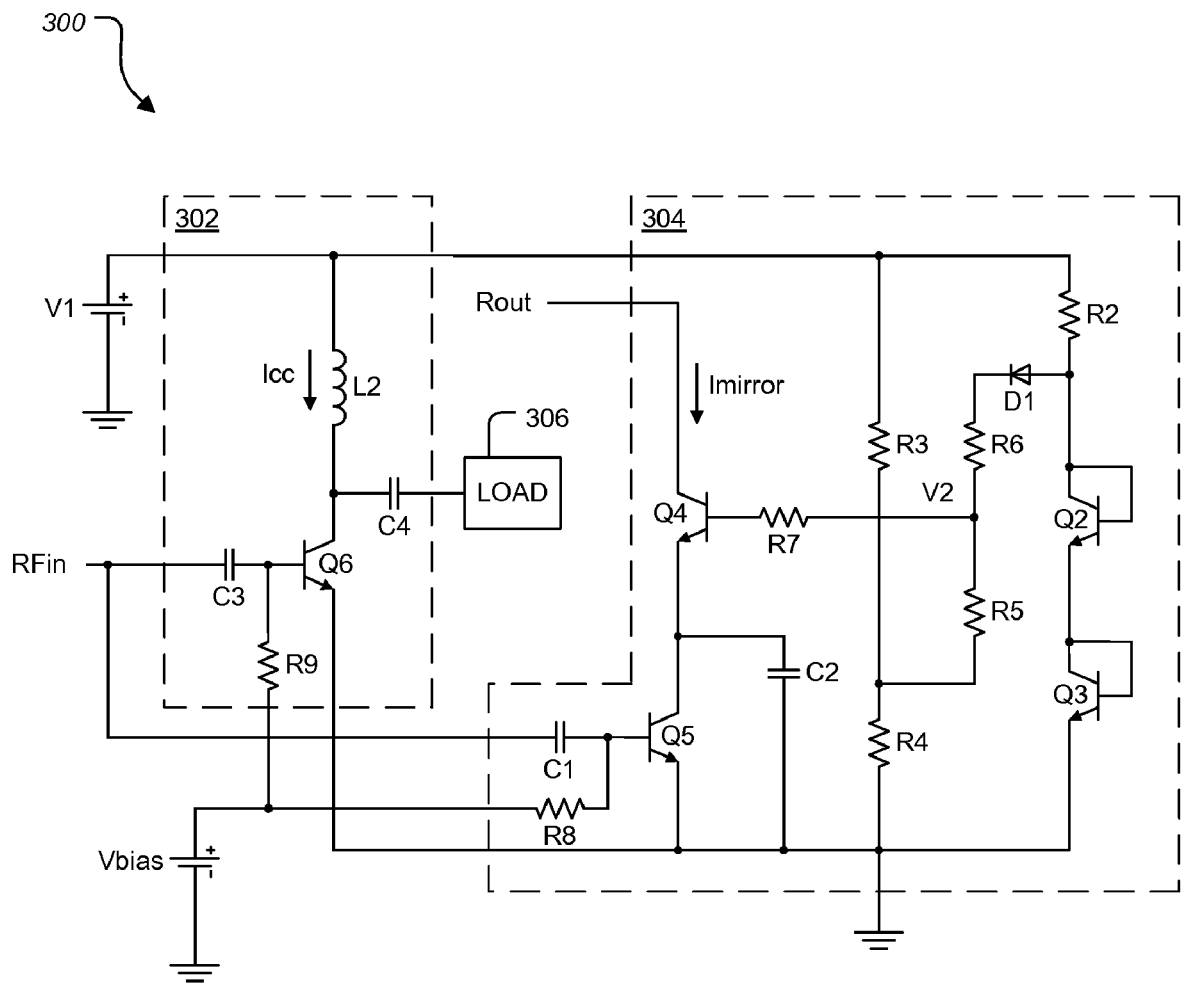
FIG. 3 illustrates a schematic diagram of a RF power amplifier mirror circuit according to one embodiment of the present invention.

FIG. 3 illustrates a RF power amplifier mirror circuit 300 according to one embodiment of the present invention. Circuit 300 comprises an output stage 302, a mirror circuit 304, a supply voltage V1, a bias voltage Vbias, an RFin signal, an output reference signal Rout, and a load 306. Output stage 302 comprises a transistor Q6, capacitors C3 and C4, a resistor R9, and an inductor L2. For simplicity and clarity, only a single transistor Q6, capacitors C3 and C4, a single resistor R9 and a single inductor L2 of output stage 302 is shown and described. Although output stage 302 is shown and described as having only these components, any number of transistors, capacitors, resistors, inductors, or other components may be used.

Mirror circuit 304 comprises transistors Q2-Q5, capacitors C1 and C2, resistors R2-R8, and a diode D1. Mirror circuit 304 provides an output reference signal Rout that is proportional to the degree of current consumption of output stage 302. As described in more detail below, when the current increases in output stage 302, mirror circuit 304 provides an output reference signal Rout. This output reference signal Rout may activate external circuitry to reduce the current in output stage 302 and thereby decrease the power consumption of output stage 302 and maintain the battery life of wireless device 200.

Embodiments of the present invention operate in conjunction with the reactive elements of transistor Q6 of output stage 302. For example, as the impedance on the collector of transistor Q6 changes, such as during a load mismatch condition, the voltage waveform on the base and emitter of transistor Q6 also changes in phase and magnitude. Transistor Q5 is a mirror transistor and is coupled in parallel with transistor Q6, such that the base and emitter of transistor Q5 are coupled to the base and emitter of transistor Q6, respectively. Thus, in accordance with the principles of embodiments of the present invention, the load mismatch condition presented on the collector of transistor Q6 is resident on the base and emitter of transistors Q5 and Q6.

In one embodiment of the present invention, transistors Q5 and Q6 are biased via resistors R8 and R9, respectively, and bias voltage Vbias. Although transistors Q5 and Q6 are shown and described as biased via resistors R8 and R9 any number of resistors or other components may be used. In addition, as discussed above, transistor Q5 is a mirror transistor and mirrors the current in transistor Q6 of output stage 302, that is mirror current Imirror mirrors collector current Icc. The mirroring ratio of transistor Q5 is set by the value of capacitor C1, resistor R8, and the selection of transistor Q5. As an example only and not by way of limitation, the mirroring ratio may be set to a 1,000:1 ratio, such that the collector current Icc of transistor Q6 is set at 1-2 A's and the mirror current Imirror of mirror circuit 304 is set at 1-2 mA's. Accordingly, capacitor C1, resistor R8, and transistor Q5 provide for the mirror current Imirror of mirror circuit 304 to be scaled to a mirror ratio, of, for example, a 1,000 times smaller, than the collector current Icc of transistor Q6 of output stage 302.

Transistors Q2 and Q3 are configured as diodes and regulate the voltage V2 as supply voltage V1 varies through resistor R2. In addition, diode D1 and transistors Q2 and Q3 provide temperature compensation for mirror circuit 304. For example, the current through resistor R2 and transistors Q2 and Q3 increases or decreases in proportion to the change in supply voltage V1 of circuit 304. However, since transistors Q2 and Q3 are configured as diodes, the voltage across transistors Q2 and Q3 remains substantially constant over variations in supply voltage V1 but varies with a two diode dependence with temperature. In addition, diode D1 provides further temperature compensation for the bias voltage V2, through a voltage level shift and reduction of the two diode temperature dependence of the voltage across transistors Q2 and Q3. For example, when the temperature increases in diode D1, the voltage across diode D1 decreases and when the temperature decreases in diode D1, the voltage across diode D1 increases. Accordingly, as the current through resistor R2 and transistors Q2 and Q3 vary, diode D1 provides temperature compensation through a voltage level shift of the voltage across transistors Q2 and Q3 at voltage V2. Although transistors Q2 and Q3 and diode D1 are shown and described for compensating for the temperature variation of mirror circuit 304, any number of transistors, diodes, or components may be used.

Resistors R3 and R4 are configured as a voltage divider to further compensate for any error in the mirroring ratio due to variations in supply voltage V1. In addition, resistors R5 and R6, which are coupled with diode D1, are configured as a voltage divider, to provide a temperature compensated bias voltage on the base of transistor Q4. Resistor R7 is provided for setting the bias current of transistor Q4. Transistors Q4 and Q5 are coupled in a cascode configuration, wherein transistor Q4 provides an emitter voltage to the collector of transistor Q5 thereby compressing transistor Q5 just above conduction. Accordingly, transistor Q5 is set at a low current density, while maintaining a significant drive on the base of transistor Q5 from the RFin signal associated with transistor Q6. It is important to note, that operating transistor Q5 in this low current density state, provides for a minimal amount of current to drive mirror circuit 304, rather than placing a series resistive element in the battery path like some prior art. Capacitor C2 filters the RF component associated with the significant drive on the base of transistor Q5 and stabilizes the voltage waveform on the collector of transistor Q5.

In one embodiment of the present invention, RF power amplifier mirror circuit 300 is fabricated using pseudomorphic high electron mobility transistor (PHEMT) technology, which is a semiconductor field effect transistor (FET) technology. However, RF power amplifier mirror circuit 300 may be fabricated using other semiconductor FET technologies, including, for example, but not limited to, metal semiconductor field effect transistor (MESFET), junction field effect transistor (jFET), high electron mobility transistor (HEMT), metamorphic high electron mobility transistor (mHEMT), heterostructure field effect transistor (HFET), modulation-doped field effect transistor (MODFET), or any other suitable compound semiconductor FET technologies.

Semiconductor materials used to fabricate RF power amplifier mirror circuit 300 may include materials, such as, for example, Gallium Arsenide (GaAs), Indium Phosphide (InP), Gallium Nitride (GaN), and derivatives of the foregoing, such as Aluminum Gallium Arsenide (AlGaAs), Indium Gallium Arsenide (InGaAs), Indium Gallium Phosphide (InGaP), Indium Aluminum Arsenide (InAlAs), Aluminum Gallium Nitride (AlGaN), Indium Gallium Nitride (InGaN), Gallium Arsenide Antimonide (GaAsSb), Indium Gallium Arsenide Nitride (InGaAsN), and Aluminum Arsenide (AlAs), for example. In one embodiment of the present invention, RF power amplifier mirror circuit 300 is formed on a Gallium Arsenide (GaAs) substrate. However, RF power amplifier mirror circuit 300 may be formed on other types of substrates, such as, for example, Indium Phosphide (InP) and Gallium Nitride (GaN).

In one embodiment of the present invention, transmitter 206 of wireless device 200 of FIG. 2 comprises RF power amplifier circuitry, including RF power amplifier mirror circuit 300. In addition or as an alternative, output stage 302 is an output stage of an RF power amplifier associated with the RF power amplifier circuitry of wireless device 200. Output stage 302 and in particular transistor Q6 may be driven by the RFin signal via a RF driver stage or by TX/RX circuitry 210 of wireless device 200. In addition, output stage 302 may transmit the RFin signal via load 306. In one embodiment of the present invention, load 306 may be an antenna and may be, for example, antenna 202 of wireless device 200 of FIG. 2.

To further explain the operation of circuit 300, an example is now given. In the following example, wireless device 200 experiences an antenna mismatch condition, such as, for example, when antenna 202 comes in close proximity with objects, for example, metal structures, human contact, or the like. Although a load mismatch of transistor Q6 of output stage 302 is described as a mismatch generated from an antenna mismatch condition, the present invention contemplates any suitable mismatch condition. For example, a load mismatch condition may be any mismatch condition that causes the collector current Icc to increase in transistor Q6 of output stage 302, thereby increasing the power consumption and decreasing the battery life or exceeding the adjacent channel power ratio (ACPR) and error vector magnitude (EVM) limits of wireless device 200.

In addition, or as an alternative, during a load mismatch condition in which the optimal load impedance of output stage 302 decreases, the collector current Icc of transistor Q6 will increase. This change in collector current Icc causes the voltage waveform on the base and emitter of transistor Q6 to change in phase and magnitude. Since, the base and emitter of transistor Q5 are coupled in parallel with the base and emitter of transistor Q6, the voltage waveform on the base and emitter of transistor Q5 will also change in phase and magnitude. Thus, in accordance with the principles of embodiments of the present invention, the mirror current Imirror of mirror circuit 304 will vary proportionally with the collector current Icc of transistor Q6 and provide an output reference signal Rout that is proportional to the degree of change in the current of output stage 302.

As described above, since transistor Q5 is operated in a low current density state, mirror circuit 304 consumes less current consumption than, for example, placing a series resistive element in the battery path, like some prior art. Among other things, this eliminates the series resistance in the battery path of embodiments of the present invention, which enables embodiments of the present invention to decrease the power consumption of output stage 302 and thereby maintain the battery life of wireless device 200.

In addition, embodiments of the present invention provide for a non-intrusive means to detect the change of current in output stage 302, rather than placing a series resistive element in the battery path like some prior art. Among other things, this reduces the complexity of embodiments of the present invention, reduces the amount of device area consumed, and reduces the cost of the components that includes the mirror circuit of embodiments of the present invention.

Reference in the foregoing specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the exemplary embodiments of the present invention have been shown and described, it will be understood that various changes and modifications to the foregoing embodiments may become apparent to those skilled in the art without departing from the spirit and scope of the present invention. Accordingly, the invention is not limited to the embodiments disclosed, but rather by the appended claims and their equivalents.

What is claimed is:

1. A mirror circuit, comprising:
  a voltage operably coupled with the mirror circuit;
  a bias circuit operably coupled with the mirror circuit, the bias circuit capable of applying a bias voltage to the mirror circuit;
  a first transistor having a base and a collector, the base of the first transistor operably coupled with the bias circuit through at least one resistor;
  a second transistor having a base, a collector, and an emitter, the emitter of the second transistor operably coupled with the collector of the first transistor, wherein the collector of the second transistor provides the output reference signal;
  a voltage divider circuit for setting the bias voltage of the second transistor, the voltage divider circuit operably coupled to the base of the second transistor and a diode, wherein the diode is operably coupled between the voltage divider circuit and the voltage; and
  an output reference signal.

2. The circuit of claim 1, further comprising:
  a third transistor having a base, a collector, and an emitter, the base of the third transistor operably coupled with the collector of the third transistor and the emitter of the third transistor operably coupled with a ground;

a fourth transistor having a base, a collector, and an emitter, the base of the fourth transistor operably coupled with the collector of the fourth transistor, the emitter of the fourth transistor operably coupled with the collector of the third transistor, and at least one resistor operably between the collector of the fourth transistor and the voltage.

3. The circuit of claim 1, further comprising:
a capacitor operably coupled between the collector of the first transistor and the emitter of the first transistor.

4. The circuit of claim 1, further comprising:
at least one resistor operably coupled between the base of the first transistor and the bias voltage.

5. The circuit of claim 1, further comprising an output stage capable of amplifying a radio frequency (RF) signal.

6. The circuit of claim 5, wherein the output stage is operably coupled to an output load.

7. The circuit of claim 5, wherein the output stage comprises:
an output transistor having a base and a collector, the collector of the output transistor operably coupled with the output load; and
at least one inductor operably coupled between the collector of the output transistor and the voltage.

8. The circuit of claim 7, wherein one or more capacitors operably couple the RF signal between the base of the first transistor and base of the output transistor.

9. The circuit of claim 7, wherein the first transistor further comprises an emitter and the output transistor further comprises an emitter, the emitter of the first transistor operably coupled to the emitter of the output transistor.

10. The circuit of claim 7, further comprising a capacitor operably coupled between the output transistor and the output load.

11. The circuit of claim 7, wherein the voltage is a battery voltage.

12. The circuit of claim 7, wherein the mirror circuit is capable of detecting a change in current of the output stage and in response, providing the output reference signal that is proportional to the change of current in the output stage.

13. The circuit of claim 7, further comprising:
at least one resistor operably coupled between the base of the output transistor and the bias voltage.

14. The circuit of claim 7, wherein the mirror circuit is fabricated in Gallium Arsenide (GaAs).

15. The circuit of claim 7, wherein the mirror circuit is fabricated in a semiconductor field effect transistor technology selected from the group consisting of:
pseudomorphic high electron mobility transistor;
metal semiconductor field effect transistor;
junction field effect transistor;
high electron mobility transistor;
metamorphic high electron mobility transistor;
heterostructure field effect transistor; and
modulation-doped field effect transistor.

16. The circuit of claim 15, wherein the semiconductor technology includes material selected from the group consisting of:
Gallium Arsenide;
Indium Phosphide;
Gallium Nitride;
Aluminum Gallium Arsenide;
Indium Gallium Arsenide;
Indium Gallium Phosphide;
Indium Aluminum Arsenide;
Aluminum Gallium Nitride;
Indium Gallium Nitride;
Gallium Arsenide Antimonide;
Indium Gallium Arsenide Nitride; and
Aluminum Arsenide.

17. A wireless device, comprising:
a transmitter for transmitting RF signals, the transmitter comprising:
an output power amplifier stage; and
a mirror circuit operably coupled with the output power amplifier stage for detecting a change in current of the output power amplifier stage, wherein the mirror circuit comprises:
a voltage operably coupled with the mirror circuit;
a bias circuit operably coupled with the mirror circuit, the bias circuit capable of applying a bias voltage to the mirror circuit; and
an output reference signal;
a battery connected to the transmitter of the wireless device;
a first transistor having a base and a collector, the base of the first transistor operably coupled with the bias circuit through at least one resistor;
a second transistor having a base, a collector, and an emitter, the emitter of the second transistor operably coupled with the collector of the first transistor, wherein the collector of the second transistor provides the output reference signal; and
a voltage divider circuit for setting the bias voltage of the second transistor, the voltage divider circuit operably coupled to the base of the second transistor and a diode, wherein the diode is operably coupled between the voltage divider circuit and the voltage; and
an antenna operably coupled to the output power amplifier stage of the transmitter.

18. The wireless device of claim 17, further comprising:
a third transistor having a base, a collector, and an emitter, the base of the third transistor operably coupled with the collector of the third transistor and the emitter of the third transistor operably coupled with a ground;
a fourth transistor having a base, a collector, and an emitter, the base of the fourth transistor operably coupled with the collector of the fourth transistor, the emitter of the fourth transistor operably coupled with the collector of the third transistor, and at least one resistor operably between the collector of the fourth transistor and the voltage.

19. The wireless device of claim 18, wherein the output power amplifier stage comprises:
an output transistor having a base and a collector, the collector of the output transistor operably coupled with the antenna; and
at least one inductor operably coupled between the collector of the output transistor and the voltage.

20. The wireless device of claim 19, wherein the first transistor further comprises an emitter and the output transistor further comprises an emitter, the emitter of the first transistor operably coupled to the emitter of the output transistor.

21. The wireless device of claim 20, wherein the mirror circuit is capable of detecting a change in current of the output power amplifier stage and in response, providing the output reference signal that is proportional to the change of current in the output power amplifier stage.

22. The wireless device of claim 20, wherein the voltage is the battery voltage.

* * * * *